(12) United States Patent
Domadia et al.

(10) Patent No.: US 6,806,715 B1
(45) Date of Patent: Oct. 19, 2004

(54) ILLUMINABLE INDICATOR TESTING APPARATUS

(75) Inventors: Ashok Domadia, Fremont, CA (US); Ronald Westhauser, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 285 days.

(21) Appl. No.: 10/150,689

(22) Filed: May 17, 2002

(51) Int. Cl.⁷ .............................................. G01R 31/00
(52) U.S. Cl. ....................................... 324/414; 702/117
(58) Field of Search ......................... 324/414; 702/117

(56) References Cited

U.S. PATENT DOCUMENTS

| | | | | |
|---|---|---|---|---|
| 5,572,444 A | * | 11/1996 | Lentz et al. ................. | 702/117 |
| 6,564,161 B1 | * | 5/2003 | Lin et al. ...................... | 702/117 |
| 6,678,845 B1 | * | 1/2004 | Farooq ........................ | 714/712 |

* cited by examiner

Primary Examiner—Charles H. Nolan, Jr.

(57) ABSTRACT

An apparatus for determining conditions of light indicators of an electronic device. The electronic device is coupled to a testing unit. The testing unit performs a series of tests on the electronic device. During these tests, an imaging device captures digital images of the light indicators. Afterwards, the digital images are compared against the test results to determine the conditions, such as the color, brightness, and pass/fail of the light indicators.

29 Claims, 13 Drawing Sheets

1200

Initiating testing of node indicator lights subsequent to receiving a network device in an indicator light tester. The indicator light tester is adapted to test the indicator lights coupled to the network device. — 1210

Capturing images of said node indicating lights by said testing apparatus during said testing. — 1220

Generating data regarding said testing. — 1230

Processing the data and viewably displaying the results of the testing. — 1240

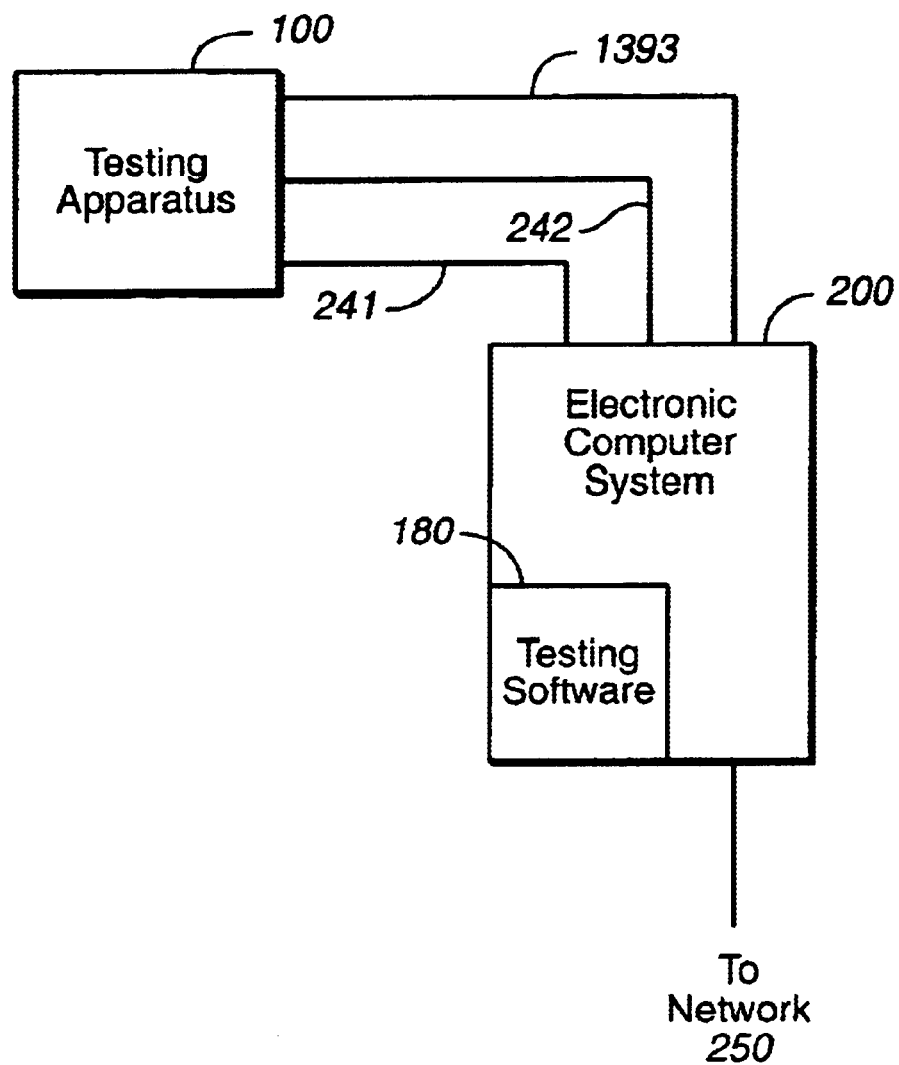
FIG._1A

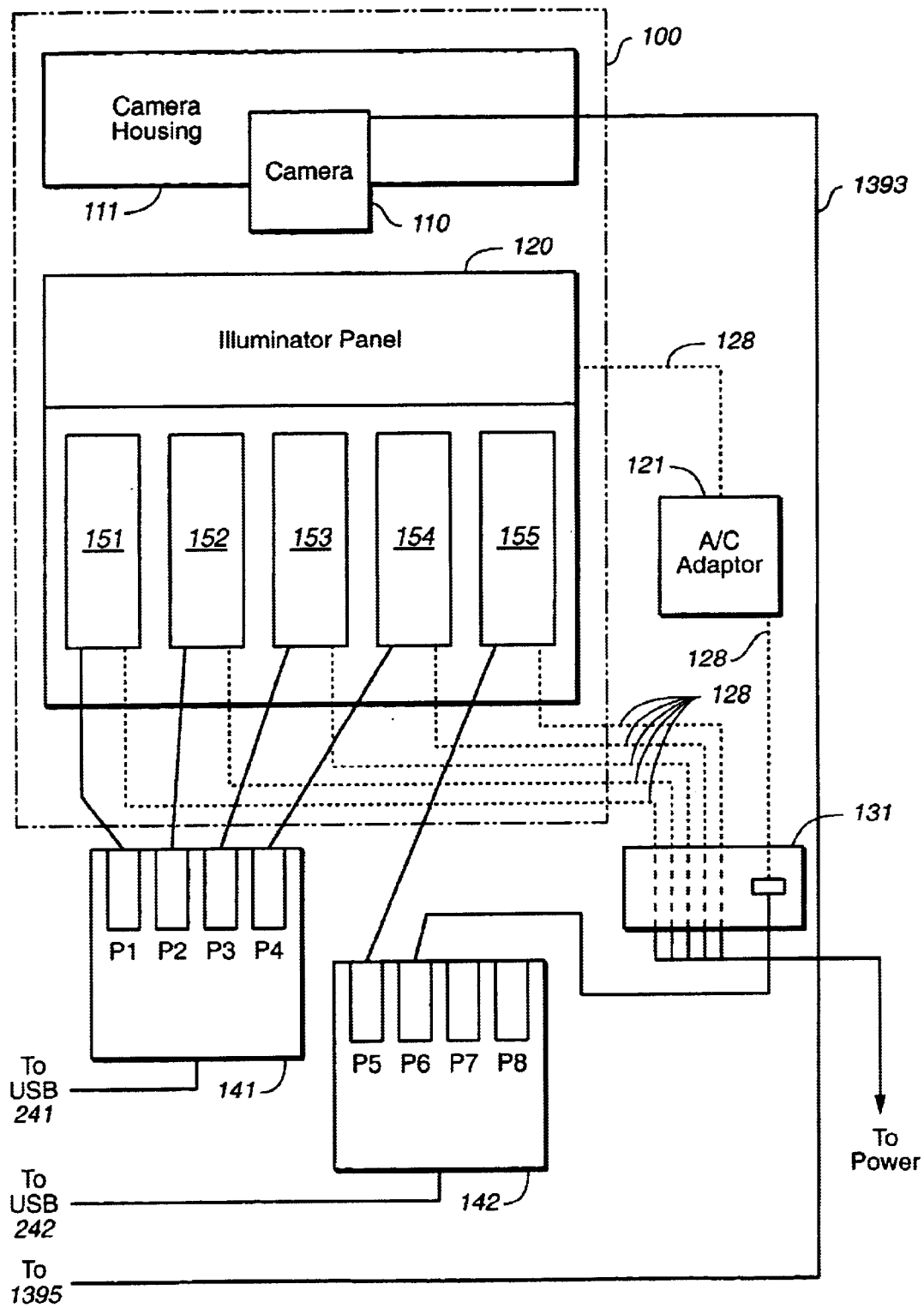
FIG._1B

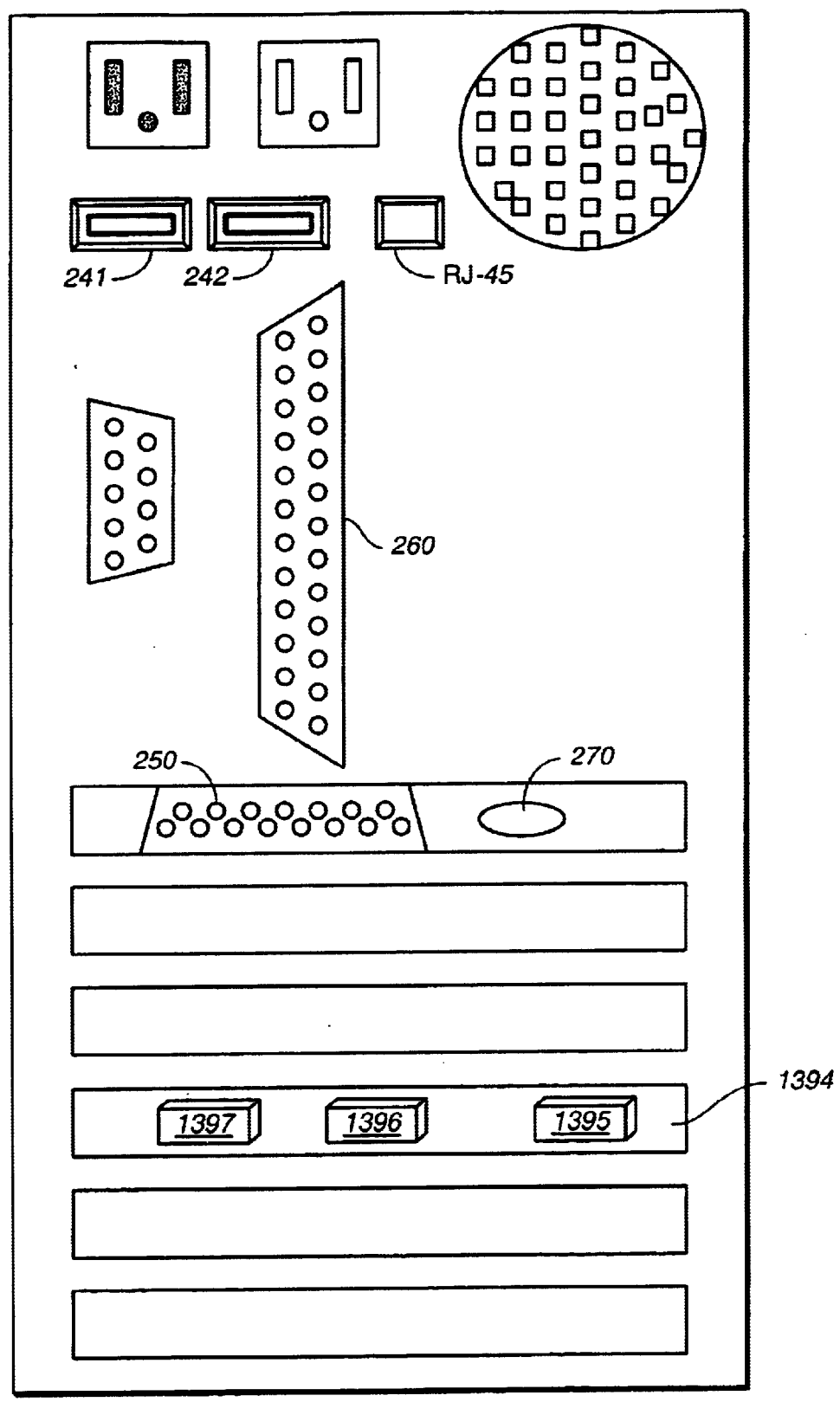
FIG._2

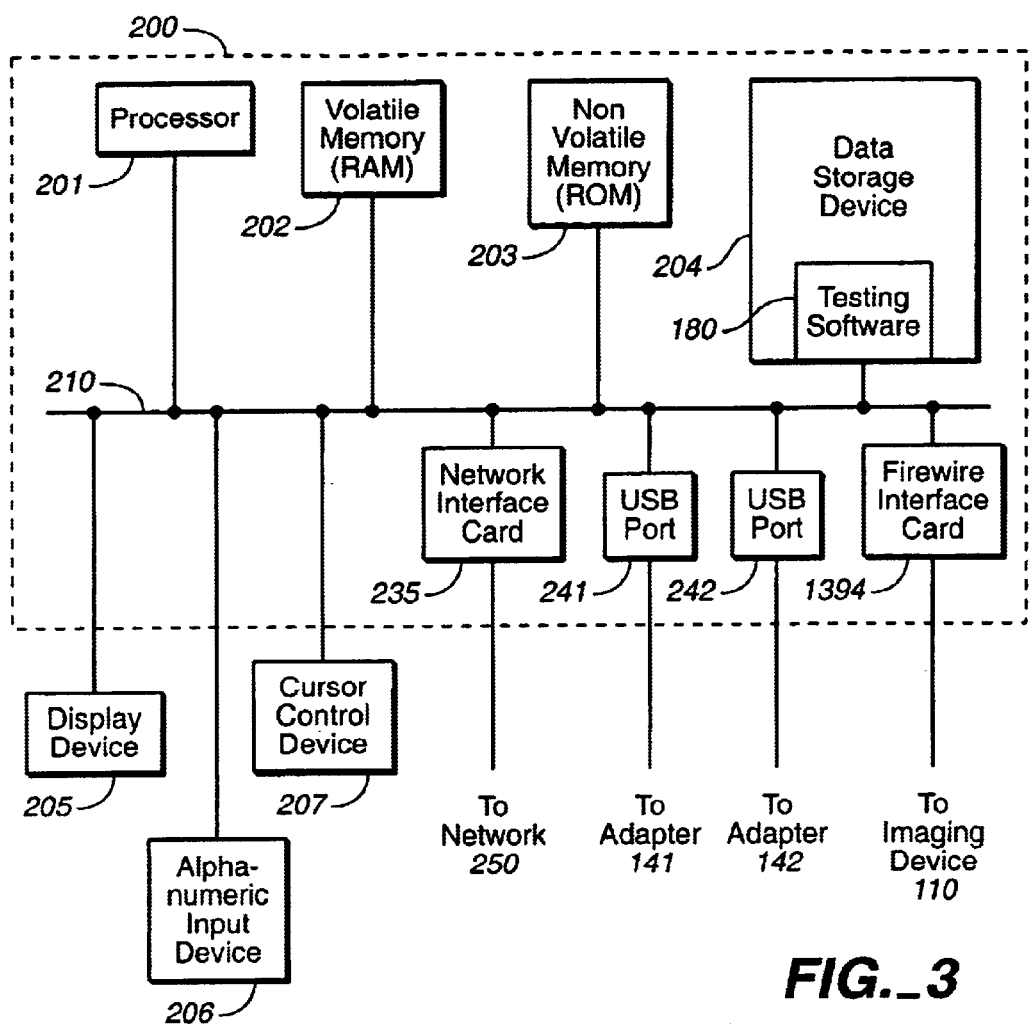
FIG._3
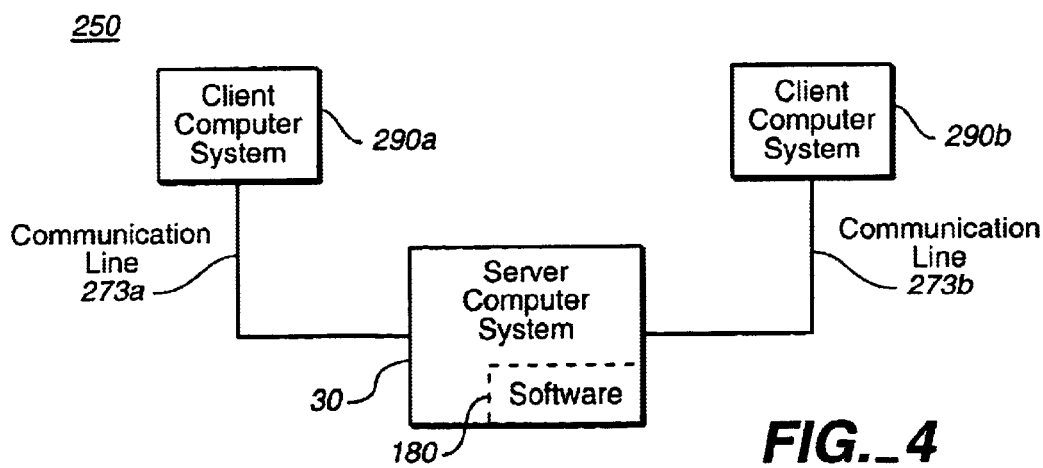
FIG._4

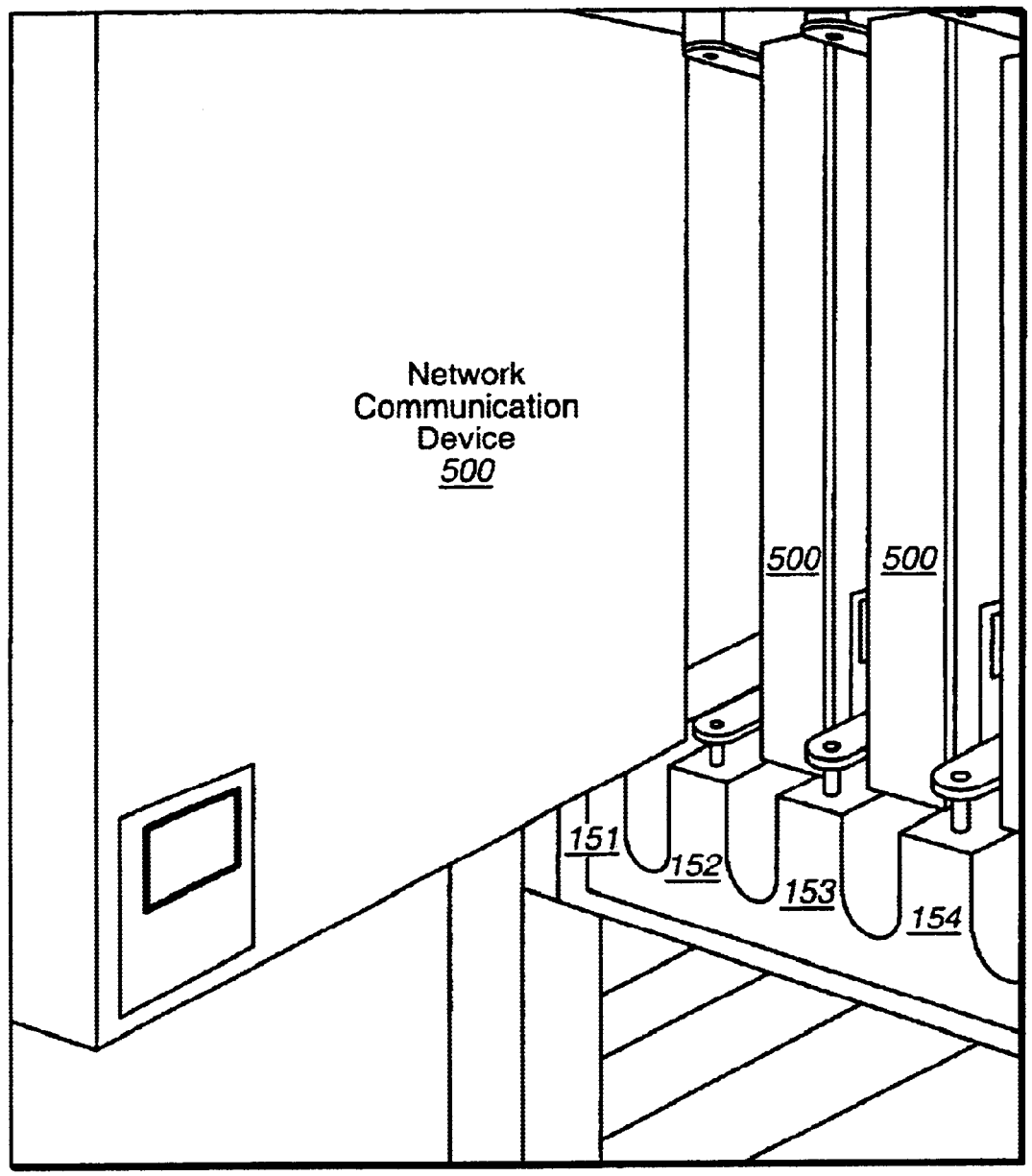
FIG._5

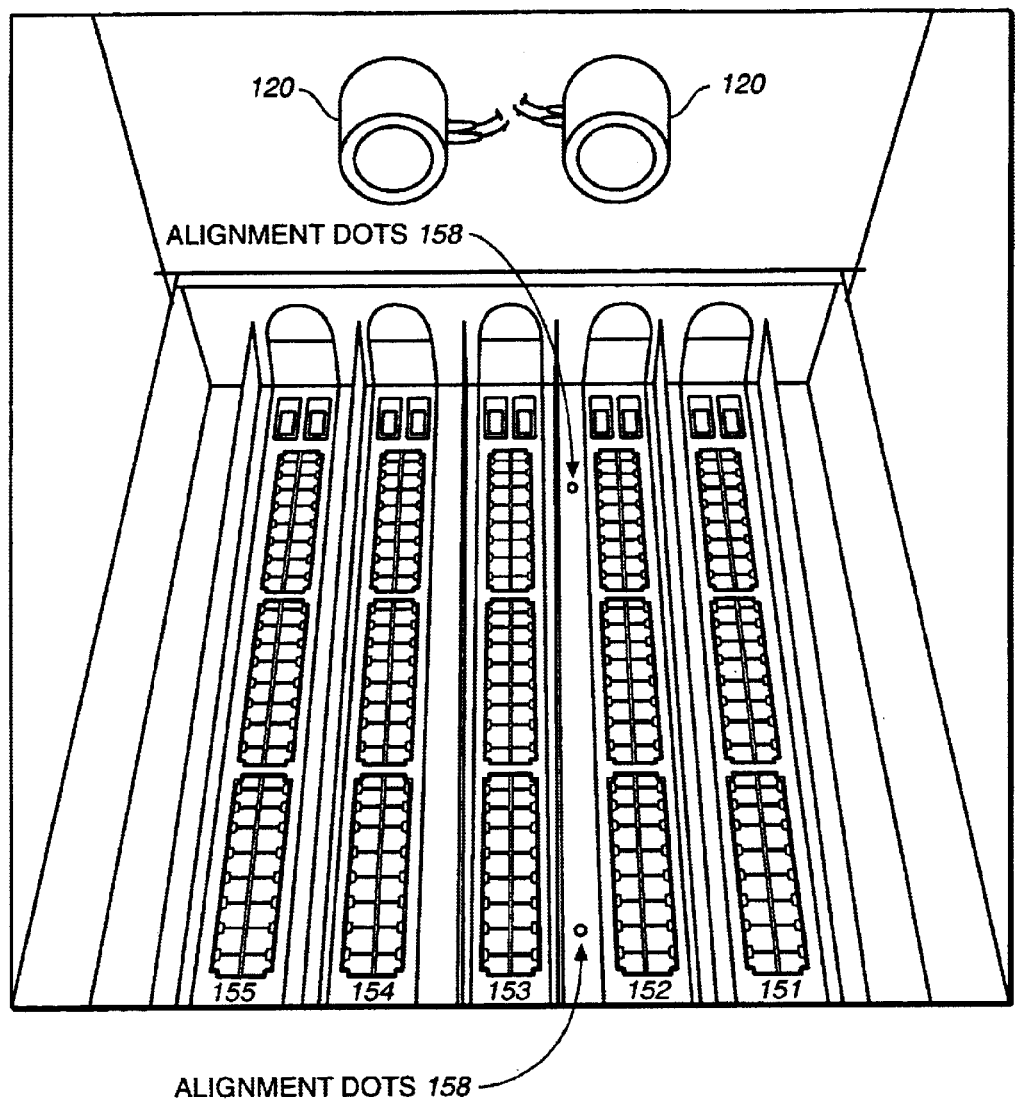
FIG._6

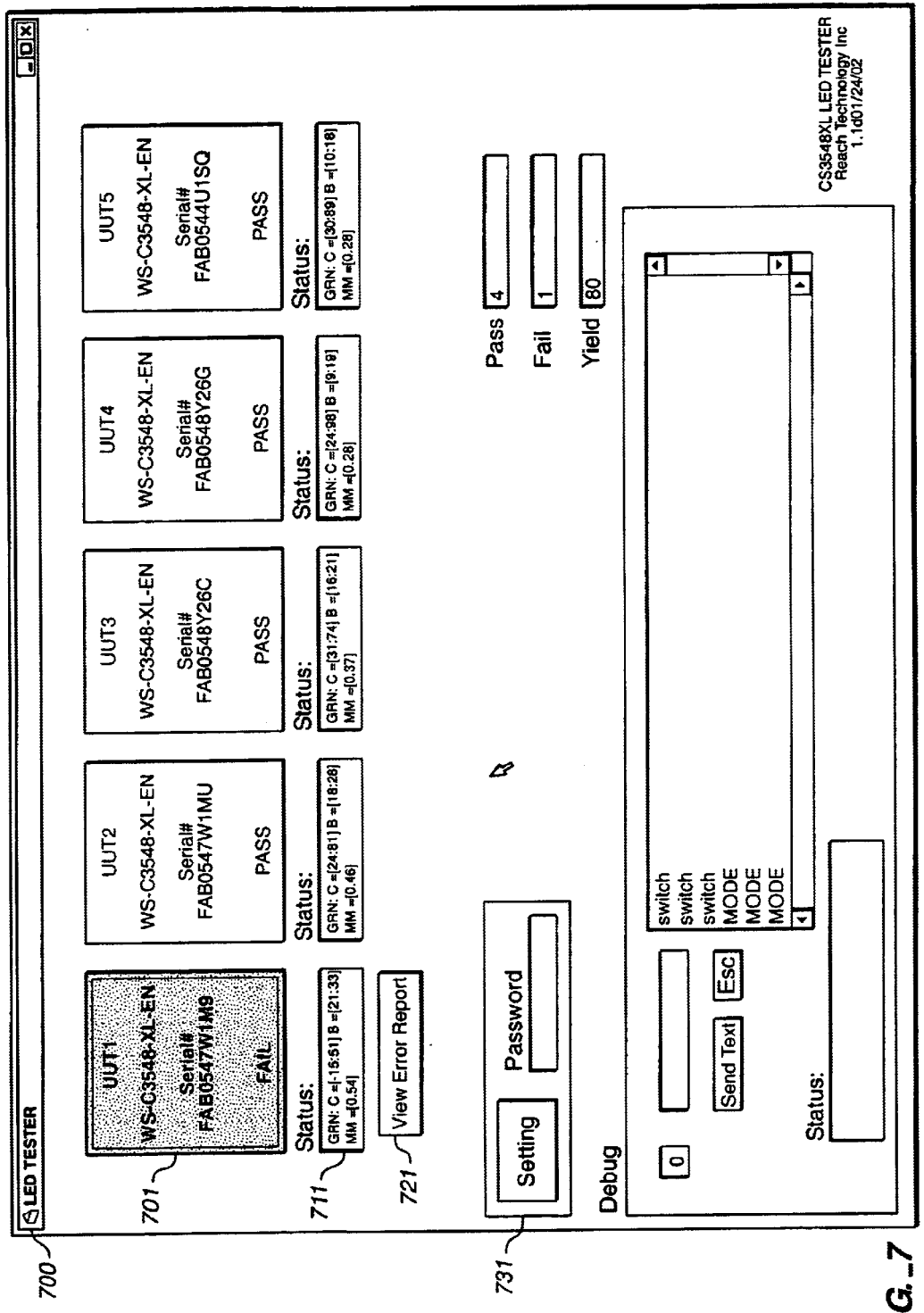
FIG._7

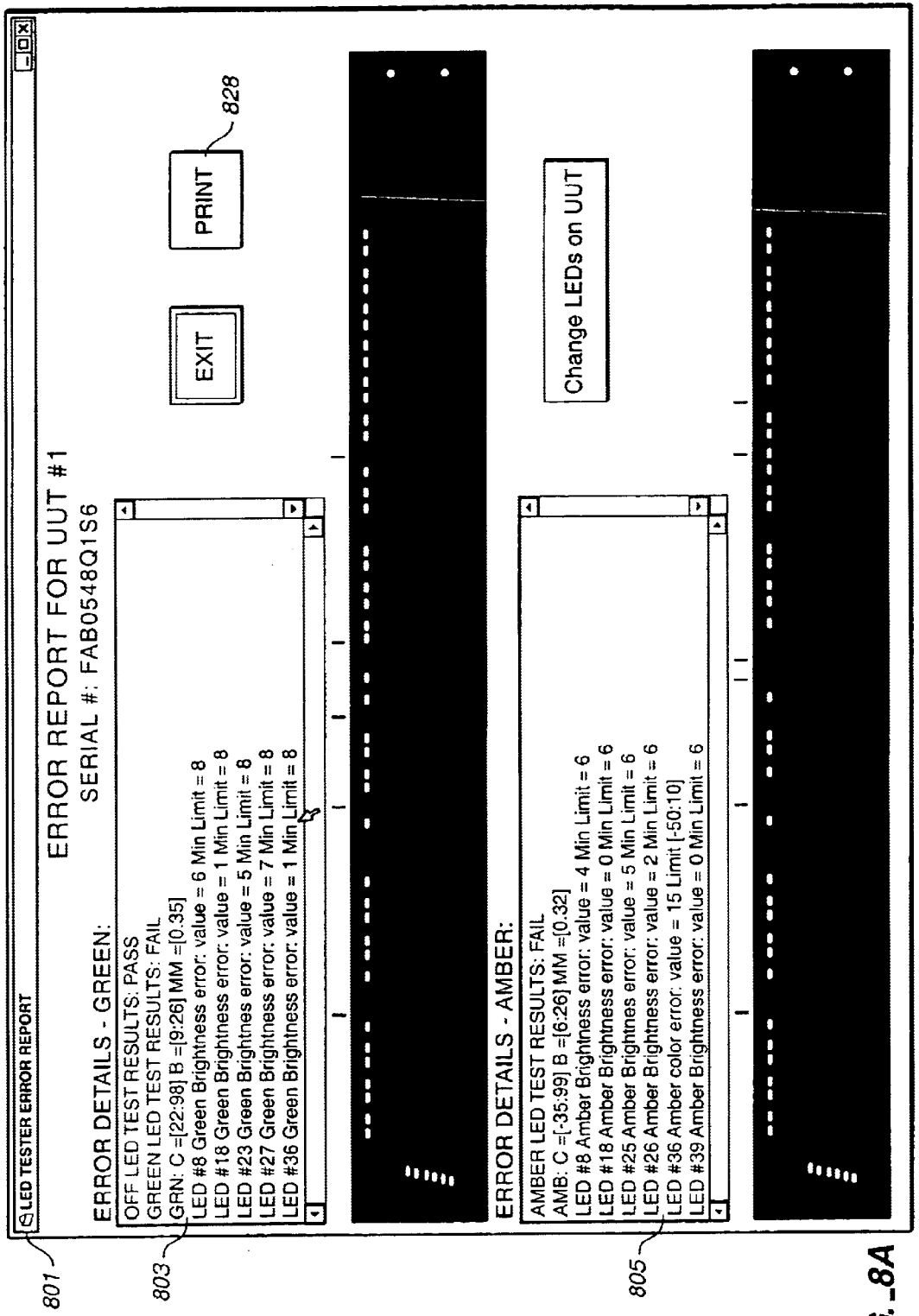
FIG._8A

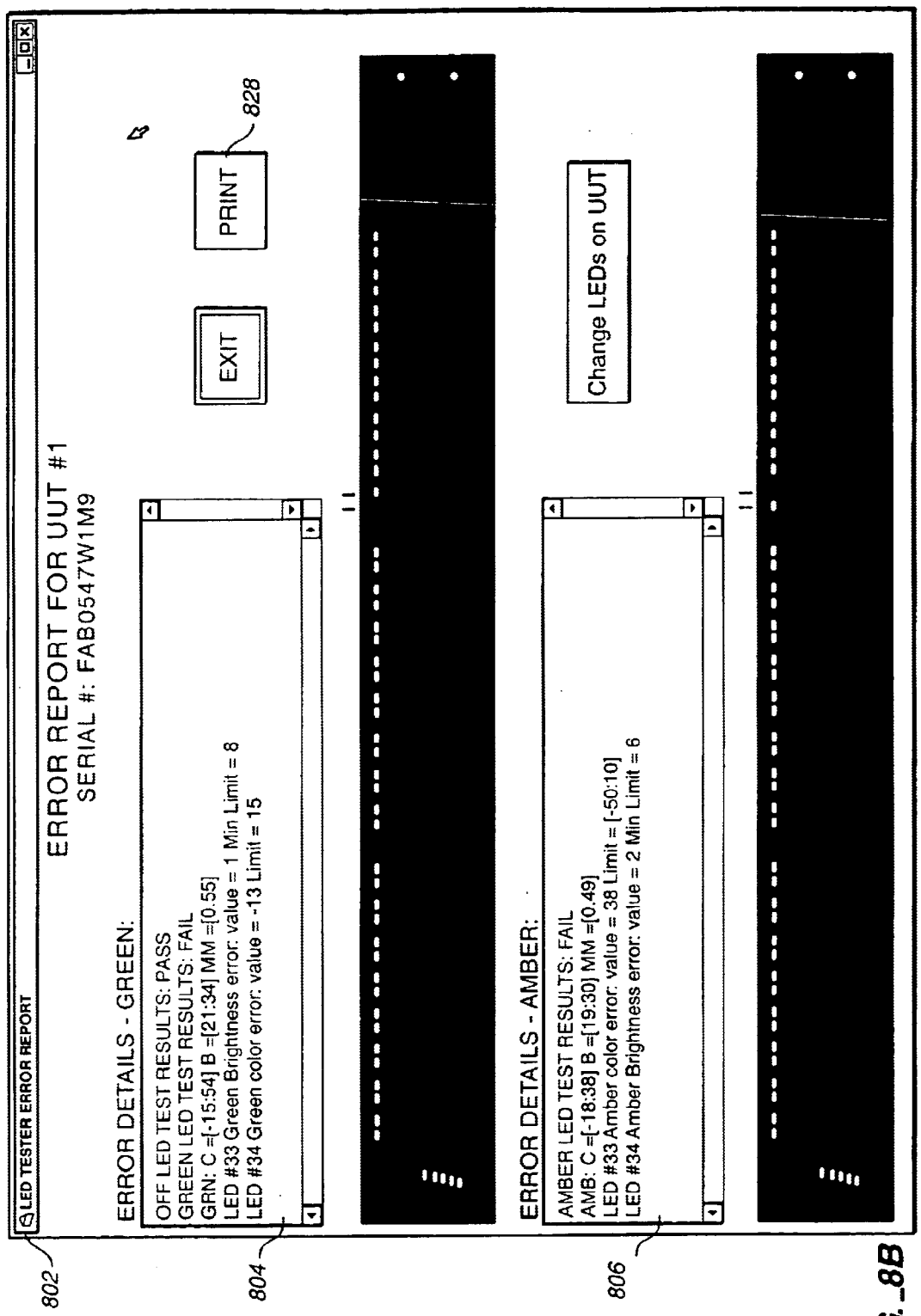
FIG._8B

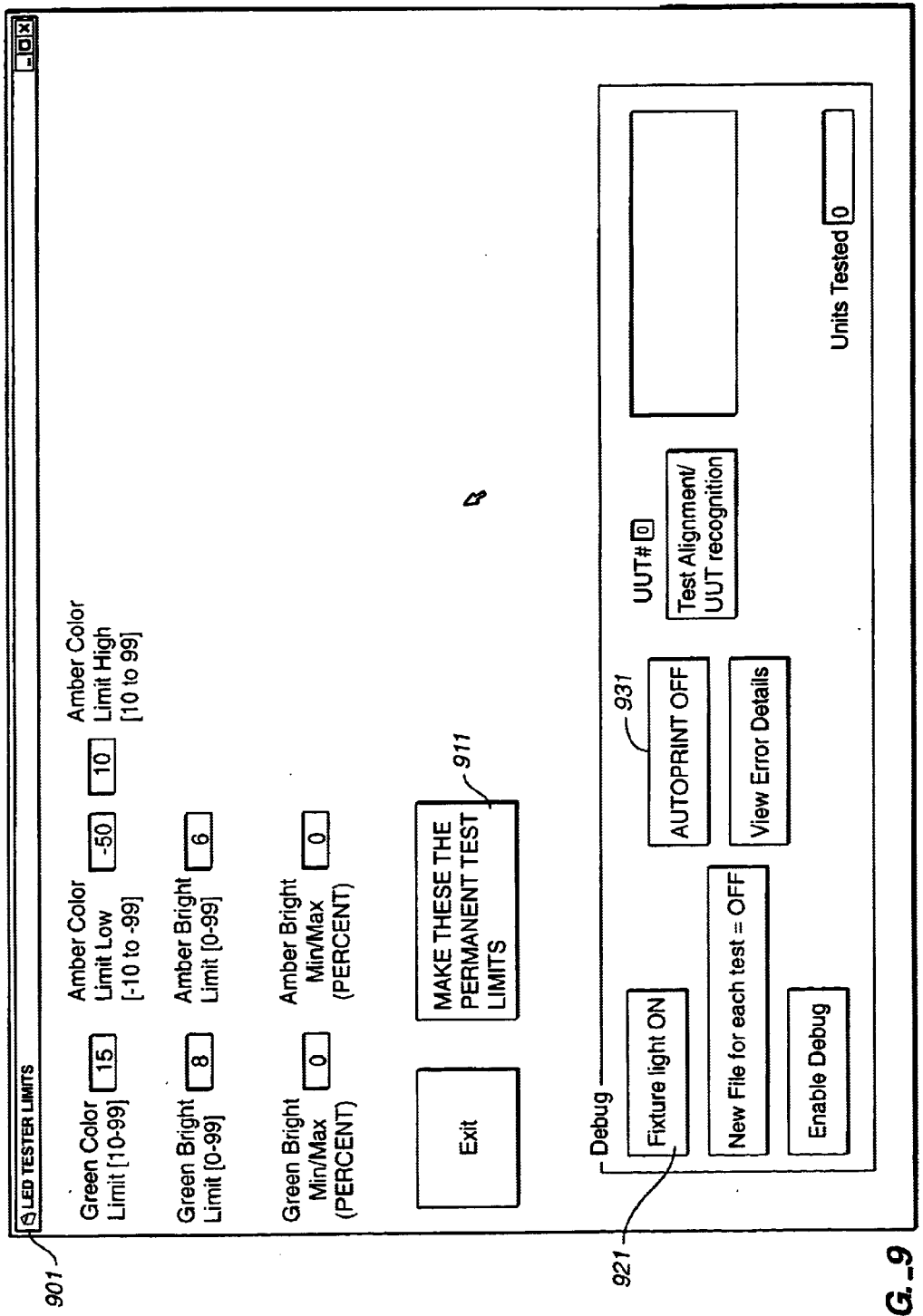
FIG._9

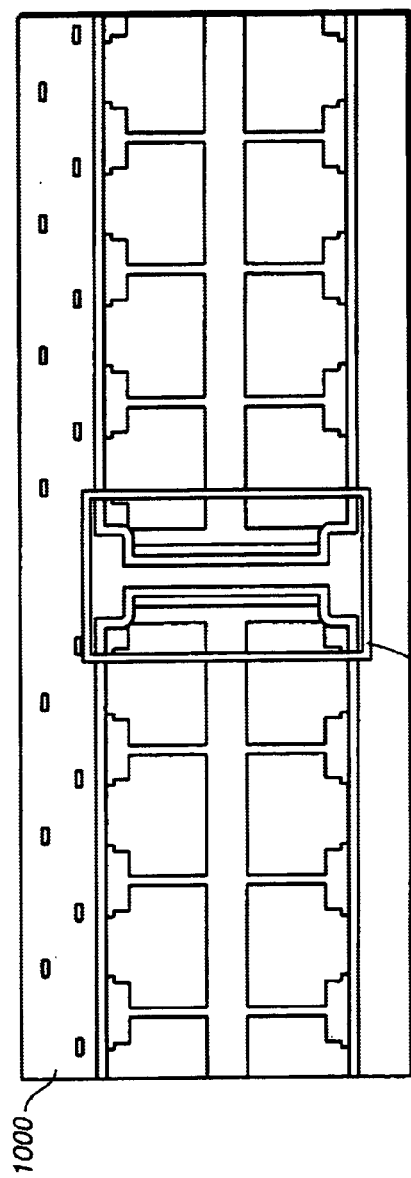
FIG._10
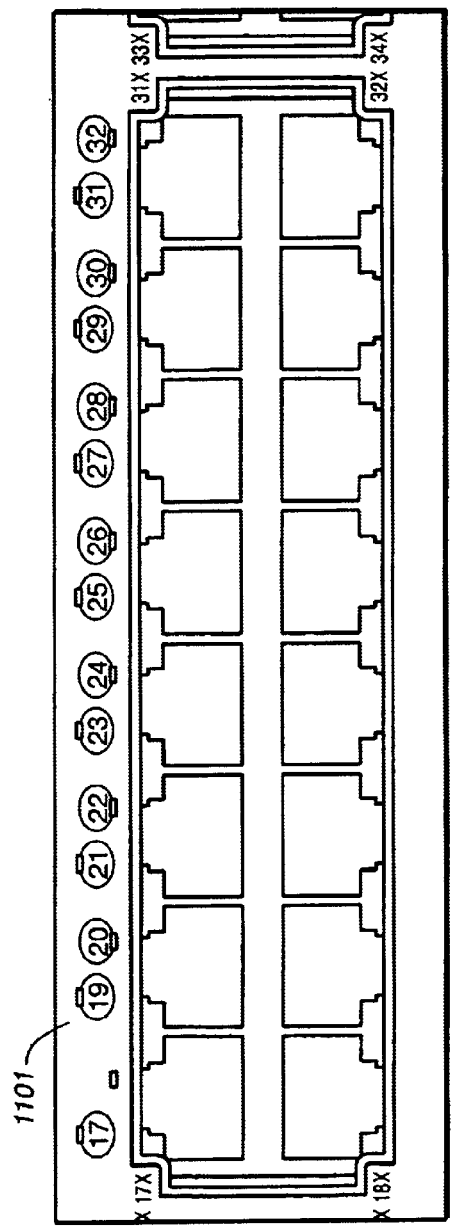
FIG._11A

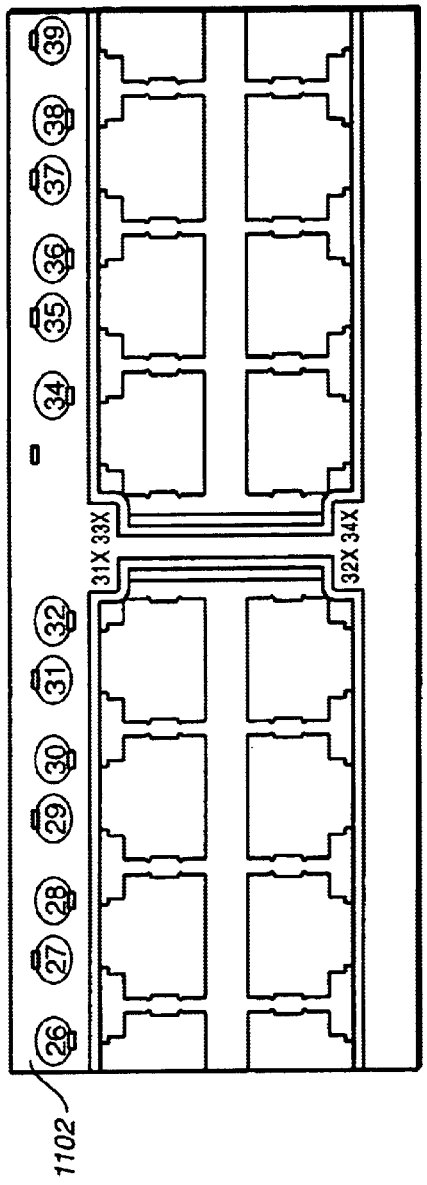
FIG._11B
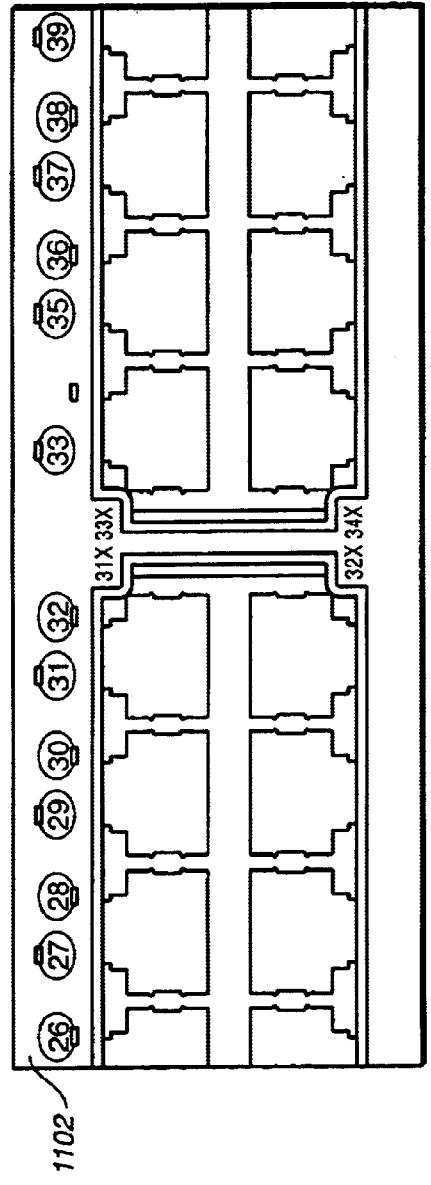
FIG._11C

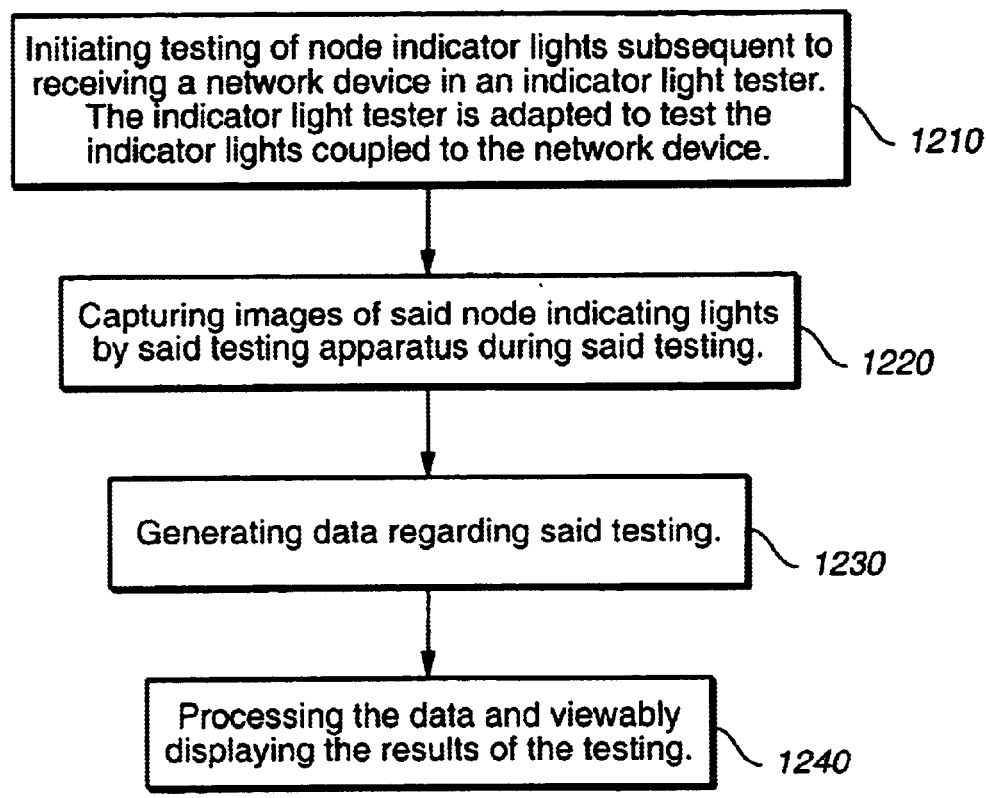
FIG._12

ILLUMINABLE INDICATOR TESTING APPARATUS

FIELD OF THE INVENTION

The present invention relates to an apparatus and method for testing indicating lights. More particularly, the present invention provides an apparatus and method for testing multiple collections of indicating lights.

BACKGROUND OF THE INVENTION

To provide intercommunication between computers, computer systems, and networks, a multitude of network communication devices have been developed and made available. A network communication device can be, but is not limited to, a hub, a switch, a router, a bridge, a gateway, and the like.

A network communication device can be a device into which many computers are coupled, facilitating intercommunication between those computers. Groups of computers communicatively coupled to one network device can communicate with other groups of computers communicatively coupled to other network devices.

In comparison to hub, which transmits incoming data to each computer coupled thereto, a network switch is able to obtain the address of the computer for whom the data is intended and then forward the data to that particular computer. A router, a smarter type of network switch, can determine for whom the data is intended and can also calculate the most expeditious route for the data to reach the intended recipient.

Because routers and switches, and alternative functionally analogous devices are cognizant as to where data is to be forwarded, they reduce network traffic, thus increasing the effective speed of the network. Accordingly, many companies utilizing network communication are becoming more reliant upon those types of network devices.

Network communication devices come in assorted shapes, sizes, and vary in the number of provided nodes, where the number of nodes on the network communication device equates to the number of computers which can be communicatively coupled into that device. A commonality among most network devices is each node of the device is provided with an indicator of some sort, e.g., a light, that, when activated, indicates operability and functionality of that node. Some network devices provide one indicator per node while other devices provide multiple indicators per node. Additionally, some network devices provide multiple indicators having different colors, e.g., green, red, yellow, and so on.

When a node indicator does not activate, or does not activate properly, this can be indicative of a communication problem with that node, a communication problem with the computer coupled with that node, or can signify that the node indicator is not functioning properly. A failure of a node indicator on a network communication device commonly causes a shutdown of that portion of the network until it can be determined what, if any, communication breakdown has occurred to cause the node indicator not to function or not to function properly. Shutting down a portion of a network can cause an increase in network traffic in other portions of the network, effectively slowing the network down. Shutting down portions of a network can also cause an increase in time and money expended for troubleshooting a perceived problem within the network. Depending on the size of the company in which the network communication device is used, this can cost a company from a few thousand dollars to millions of dollars in unnecessary cash outlays as well as lost revenue.

Accordingly, manufacturers of network communication devices are constantly attempting to ensure that their network communication device operates properly and that each node indicator is fully functional prior to delivery to a client or acquisition by a customer.

One way for network communication device manufacturers to test a node indicator is to have someone individually place and connect each node indicator on a printed circuit board for testing, prior to its installation into the network communication device. While this inhibits installation of a malfunctioning and/or inoperable node indicator in the network communication device, it does not address testing of the node indicator after its installation in the device. A further disadvantage in testing a node indicator this manner is that it can be slow, labor intensive, and a time consuming process.

In an alternative manner to test a node indicator, the indicator is tested subsequent to its installation into a network communication device. After installation, a technician, or the like, powers up a network communication device, and individually tests each node indicator for functionality. This alternative testing method is also slow, labor intensive, and time consuming process, and subject to human error.

Yet another alternative way to test node indicators is through utilization of testing equipment. Currently, some testing equipment models are designed to test one network communication device at a time, with human observation of node indicator defects. As such, this manner of testing is prone to human error. Testing one communication device at a time can be inefficient and can limit productivity. Other testing models are designed to provide pass/fail detection only. Still other testing models are designed for pattern recognition, and do not address differing colors or the brightness thereof.

Thus a need exists for an apparatus for testing node indicators in a network communication device that is able to test more than one indicator light at a time. Another need exists for a testing apparatus that is able to test more than one network communication device at a time. Yet another need exists for a testing apparatus that is able to test for node indicator brightness, color, and pattern recognition, as well as pass/fail.

SUMMARY OF THE INVENTION

An apparatus for determining conditions of light indicators of an electronic device is disclosed. The electronic device is coupled to a testing unit. The testing unit performs a series of tests on the electronic device. During these tests, an imaging device captures digital images of the light indicators. Afterwards, the digital images are compared against the test results to determine the conditions, such as the color, brightness, and pass/fail of the light indicators. Thereby, the conditions of numerous light indicators belonging to multiple electronic devices (e.g., network switches), can be tested simultaneously in a fast, efficient, effective, low-cost, and reliable manner.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1A is a block diagram of components in a system for node indicator testing in accordance with one embodiment of the present invention.

FIG. 1B is block diagram of components and circuitry of a testing apparatus in accordance with one embodiment of the present invention.

FIG. 2 is an illustrated rear facing view of an electronic computer system to which a testing apparatus is coupleable, in accordance with one embodiment of the present invention.

FIG. 3 is a block diagram of components and circuitry of an electronic computer system in accordance with one embodiment of the present invention.

FIG. 4 is a block diagram of a network environment in which embodiments of the present invention may be practiced, in accordance with one embodiment of the present invention.

FIG. 5 is an illustrated image showing a network device being inserted in a node indicator testing apparatus, in accordance with one embodiment of the present invention.

FIG. 6 is an illustrated image showing multiple network devices having been inserted in a node indicator testing apparatus, in accordance with one embodiment of the present invention.

FIG. 7 is a screen shot of a main user interface in accordance with one embodiment of the present invention.

FIG. 8A is a screen shot of an error report in accordance with one embodiment of the present invention.

FIG. 8B is a screen shot of an error report in accordance with one embodiment of the present invention.

FIG. 9 is a screen shot of a setting and limits user interface in accordance with one embodiment of the present invention.

FIG. 10 is a screen shot of a fiducial pattern in accordance with one embodiment of the present invention.

FIG. 11A is a screen shot of a brightness calibration unit, in accordance with one embodiment of the present invention.

FIG. 11B is a screen shot of a color calibration unit in accordance with one embodiment of the present invention.

FIG. 11C is another screen shot of a color calibration unit in accordance with one embodiment of the present invention.

FIG. 12 is flowchart of a process of testing node indicators in accordance with one embodiment of the present invention.

DETAILED DESCRIPTION

An apparatus and method for testing node indicators in a network communication device is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Some portions of the detailed descriptions, which follow, are presented in terms of procedures, steps, logic blocks, processing, and other symbolic representations of operations during testing node indicators in a network communication device. These descriptions and representations are the means used by those skilled in the network communication device and data communication arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

The present invention, an apparatus and method of testing node indicators is discussed primarily in the context of a network communication device, e.g., a network switch. However, embodiments of the present invention can be utilized in the testing of node indicators in nearly any type of network communication device including, but which is not limited to, hubs, switches, routers, bridges, gateways, and the like, that provide access to some type of network.

For purposes of the present application, the term "network communication device" is not limited solely to a network switch. Instead, the term "network communication device" or "communication device" or "network device" is also intended to include nearly device which can be used to communicate with a network. Such devices include, but are not limited to, hubs, routers, bridges, gateways, and numerous other devices which have the ability to communicate with a network or other computers. As such, for purposes of the present application, the terms "network communication device" and "communication device" and "network device" will be considered synonymous and will be used interchangeably throughout the present application.

For purposes of the present application, the term "electronic computer" or "electronic computer system" is intended to include computer systems that may or may not easily transportable, e.g., a laptop computer system and a desktop computer system or a computer workstation, respectively. Furthermore, the "electronic computer system" is configured such that it has the ability to communicate with a network or other computers, either through a wired connection e.g., a modem or a NIC (network interface card) and the like, or through a wireless connection.

Referring to FIG. 1A, testing apparatus 100 is adapted to have coupled thereto a plurality of network communication devices for testing of the node indicators disposed thereon. Electronic computer system 200 is electronically and communicatively coupled to testing apparatus 100 via a plurality of communication lines, e.g., line 241, line 242, and line 1393. Data acquired during the testing of node indicators by testing apparatus 100 is transmitted, via lines 241, 242, and 1393, to electronic computer system 200 for processing by testing software 180. That data is then displayed to a user via a display device, e.g., display device 305 of FIG. 3.

FIG. 1B is a block diagram of a testing apparatus 100 for testing node indicators in a network communication device, e.g., a network switch, in one embodiment of the present invention. Shown is a camera housing 111 which is adapted to have disposed therein a camera 110. Although not shown, it is noted that housing 111 contains therein plexiglass covers, and a camera mount for mounting camera 110 thereto. Camera 110 can be communicatively coupled to an electronic computer system, e.g., computer system 200 via a 1394 Firewire connection 1393. Camera 110 is a CCD (charged coupled device) color digital camera having an IEEE 1394 digital interface. In one example, camera 110 can be a Sony CCD color digital camera, model DFW-X700, having 1024×768 pixels. In one example, camera 110 can also include a lens, e.g., a Cosmicar/Pentax H1212B (TH) lens disposed thereon. This example of a lens for camera 110 is equipped with multiple adjusting screws for focusing and iris adjustments. It is noted that alternative CCD color digital cameras can be utilized, provided they are functionally analogous to camera 110. It is also noted that alternative lenses can be implemented, provided they are functionally analogous to a Cosmicar lens, as described above.

Also shown in FIG. 1B is an illuminator panel, e.g., illuminator panel 120. Illuminator panel 120 can include a plurality of lights, e.g., two 12 v 20 w halogen lamps, for providing illumination for camera 110 during testing of node indicators. Illuminator panel 120 is coupled to an AC adapter 121 for providing power thereto via a power connector 128. It is noted that higher or lower rated lamps can be utilized as well as being instanced in greater or fewer numbers.

Referring still to FIG. 1B, shown are TAR (testing apparatus receiving) slots 151, 152, 153, 154, and 155. TAR slots 151 to 155 are adapted to receive a network communication device, such as a network switch. In one example, a network switch can be a CISCO C3548 fifty-port/node network switch. It is noted that other network switches having fewer or greater numbers of nodes can be tested analogously provided testing apparatus receiving slots 151 to 155 are so adapted.

Still referring to camera 110 and to TAR (testing apparatus receiving) slots 151–155 of FIG. 1B, it is noted that camera 110 is disposed approximately 31.5 inches (80 cm) above TAR slots 151 to 155. This distance is to minimize lens distortion over the field of view, which can total 19 inches by 14.25 inches (48.26 cm by 36.20 cm). These dimensions enable camera 110 to view and capture the states of node indicators in five network communication devices.

Also shown in FIG. 1B are multi-port adapters 141 and 142. In the present embodiment, multi-port adapters 141 and 142 are each shown as a 4 port RS232 DB9 USB to serial adapter. The ports are represented by P1–P4 in adapter 141 and P5–P8 in adapter 142. It is noted that within adapter 141, TAR (testing apparatus receiving) slot 151 is coupled with P1, TAR slot 152 is coupled with P2, TAR slot 153 is coupled with P3, and TAR slot 154 is coupled with P4. It is further noted that within adapter 142, TAR slot 155 is coupled to P5. Adapters 141 are 142 are configured to be communicatively coupleable to USB ports of an electronic computer system, e.g., USB port 241 and USB port 242 of system 200 of FIG. 2, respectively. Functionally analogous alternative multi-port adapters may also be utilized.

Still referring to FIG. 1B, the power plugs for each TAR (testing apparatus receiving) slots 151–155 are coupled to a power cycle box 131 which is adapted to be coupled to a power source for supplying power to testing apparatus 100. In the present embodiment, the power plugs for each TAR slot are powered on by connecting the plugs to a 2511 terminal server which has the associated cells powered on. Additionally, AC adapter 121 is coupled to power cycle box 131 which is then coupled to the second port (P5) of adapter 142. Then by coupling adapter 142 to USB port 242 of electronic computer system 200, computer system 200 can toggle the DTR (data transmit) line on adapter 142 P5 to turn illuminator panel 120 on and off. It is noted that from the perspective of computer system 200, this is COM8.

FIG. 2 is illustration of a rear facing view of an electronic computer system 200. Computer system 200 is shown configured with a plurality of USB ports, e.g., USB 241 and 242. USB ports 241 and 242 are adapted to be coupled with adapters 141 and 142 respectively. It is noted that adapter 141 is to be coupled to computer system 200 at the USB port representing port 1 and that adapter 142 is to be coupled to computer system 200 at the USB port representing port 2. Computer system 200 is also configured with a network interface card RJ-45 for enabling network communication.

Still referring to FIG. 2, computer system 200 is also configured with a Firewire interface card 1394 having a plurality of connections 1395, 1396, and 1397. Firewire interface card 1394 is configured to have camera 110 coupled therewith. Also shown is parallel port 260. Testing software 180 utilizes a hardware lock on parallel port 260. A hardware lock is otherwise known as a dongle. It is noted that the dongle must be coupled to parallel port 260 to enable testing software 180 to function. Shown is a display connector 250 for having a display device, e.g., display device 205 coupled thereto. Shown is a keyboard connector 270 for having a keyboard, e.g., alphanumeric input device 206 coupled thereto.

FIG. 3 is a logical block diagram of components and circuitry of computer system 200 upon which embodiments of the present invention may be practiced. Computer system 200 includes an address/data bus 210 for communicating information, a central processor 201 coupled with the bus for processing information and instructions, a volatile memory 202 (e.g., random access memory, RAM) coupled with the bus 210 for storing information and instructions for the central processor 201 and a non-volatile memory 203 (e.g., read only memory, ROM) coupled with the bus 210 for storing static information and instructions for the processor 201. Computer system 200 also includes a data storage device 204 coupled with the bus 210 for storing information and instructions, e.g., testing software 180. Data storage device 204 can be, for example, an HDD (hard disk drive), an FDD (floppy disk drive), a memory stick, a CD-RW (compact disk with write functionality), a tape drive, etc., and furthermore device 204 can be in multiples or in a combination thereof. Data storage device 204 may also be removable or hot swappable (connected or unconnected while computer is powered).

With reference still to FIG. 3, computer system 200 also includes a network interface card 235 which is coupled to bus 210 for providing a physical communication link between computer system 200, and a network environment (e.g., network environment 250 of FIG. 4). As such, network interface card 235 enables central processor unit 201 to communicate with other electronic systems coupled to the network. It should be appreciated that the present embodiment of network interface card 235 is well suited to be implemented in a wide variety of ways. In one example, network interface card 235 is coupled to an antenna and provides the functionality to transmit and receive information over a wireless communication interface. In another example, network interface card 235 could be implemented as a modem.

Also included in computer system 200 of FIG. 3 is an optional alphanumeric input device 206. In one implementation, device 206 is a handwriting recognition pad ("digitizer"). In another implementation, device 206 is a keyboard. Alphanumeric input device 206 can communicate information and command selections to processor 201.

Computer system 200 of FIG. 3 also includes an optional cursor control or directing device (on-screen cursor control 207) coupled to bus 210 for communicating user input information and command selections to processor 201. Many implementations of the cursor control device are known in the art including a trackball, mouse, joystick or special keys on alphanumeric input device 206 capable of signaling movement of a given direction or manner of displacement. Cursor control 207 also may be directed and/or activated via input from the keyboard using special keys and key sequence commands. Alternatively, the cursor may be directed and/or activated via input from a number of specially adapted cursor directing devices.

In one implementation, cursor control device 207, when utilized in a laptop computer system 200, is a touch pad, or, in another implementation, a finger activated push stick. In another implementation, e.g., when utilized in desktop computer system 200, on-screen cursor control device 207 is a mouse or similar pointing device.

Computer system 200 also contains a display device 205 coupled to the bus 210 for displaying information to the computer user. Display device 205 is suitable for generating graphic images and alphanumeric characters recognizable to the user. Any of a number of display technologies can be used, e.g., cathode ray tube (CRT), liquid crystal display (LCD), field emission display (FED), thin film transistor (TFT), plasma, etc., for display device 205.

FIG. 4 is a block diagram illustrating an exemplary client-server computer system network 250 upon which embodiments of the present invention may be practiced. Network 250 may be a communication network located within a firewall of an organization or corporation (an "Intranet"), or network 250 may represent a portion of the World Wide Web or Internet. Client (or user) computer systems 290a and 290b and server computer system 30 are communicatively coupled via communication lines 173a and 173b; the mechanisms for communicatively coupling computer systems over the Internet or over Intranets are well-known in the art. This coupling can be accomplished over any network protocol that supports a network connection, such as IP (Internet Protocol), TCP (Transmission Control Protocol), NetBIOS, IPX (Internet Packet Exchange), and LU6.2, and link layers protocols such as Ethernet, token ring, and ATM (Asynchronous Transfer Mode). Alternatively, client computer systems 290a and 290b can be coupled to server computer 30 via an input/output port (e.g., a serial port) of server computer system 30; that is, client computer systems 290a and 290b and server computer system 30 may be non-networked devices. Though network 250 of FIG. 4 is shown to include one server computer system 30, it is appreciated that more than one server computer system 30 can be used. It is noted that, in one embodiment, electronic computer system 200 can be implemented as a server 30, and accordingly, software instructions 180 would thus be disposed in server 30.

FIG. 5 is an image of a plurality of TAR slots 151–155 within testing apparatus 100. A UUT 1 (unit under test), in this example a network communication device 500, is shown being inserted into a TAR (testing apparatus receiving) slot, in this instance TAR slot 151. It is noted that the communication ports/nodes (also referred to as GBIC (giga-bit interface connector)) disposed upon network communication device 501 are oriented toward the testing apparatus receiving slot prior to insertion. It is further noted that network communication device 501 is put into diagnostic mode prior to insertion into testing apparatus 100.

FIG. 6 is rear facing image of TAR (testing apparatus receiving) slots 151–155 having received UUTs (units under test) 1, 2, 3, 4, and 5, respectively. Shown are alignment dots 158. Dots 158 hold a UUT (unit under test) in correct alignment in a TAR (testing apparatus receiving) slot. Also shown are illuminating lamps 120 for providing illumination to the UUTs in TAR slots.

Subsequent to the insertion of UUTs into TAR slots, testing software, e.g., testing software 180 is run. In one embodiment, testing software 180 is operable under a Windows by Microsoft operating system, e.g., Windows NT 4.0.

Testing software 180 is activated when the executable file associated with the software, e.g., ledtest.exe, is initiated. Any number of well know methods to activate an executable file can be implemented.

FIG. 7 is a screen shot of a user interface, e.g., MUI (main user interface) 700 subsequent to a start button having been previously clicked, thus initiating the testing processes and generating the results. MUI 700 shows a main region 701 for displaying information regarding each UUT (unit under test), e.g., UUT 1–5. Once started, testing software 180 generates the model and serial number of each UUT within its associated main region 701. Additionally, status indicating colors can be implemented within each region to visually indicate the status of each associated UUT, as shown in Table 1, below.

TABLE 1

| | |
|---|---|
| White | Cell is idle, no UUT is detected. |
| Light Yellow | UUT detected and is booting diagnostics. |
| Yellow | UUT's LEDs are being tested. |
| Green | UUT passed test |
| Red | UUT failed test. |

It is noted that testing software 180 automatically detects units inserted in a testing apparatus receiving slot and runs diagnostics and node indicator (LED) tests.

Still referring to FIG. 7, other information relative to each UUT is, in one embodiment, displayed in a status region 711 disposed beneath each UUT's main region. When a tested UUT passes, the information regarding color range and brightness range for the LEDs are shown in status region 711. This information can be utilized advantageously in determining range limits. In one embodiment, the range limits can be determined using Formula 1, as shown below.

XXX: C=[V1:V2]B=[V3:V4]MM=[V5:V6]      Formula 1:

where

XXX is GRN or AMB

V1:V2 is the minimum and maximum range of color values found

V3:V4 is the minimum and maximum range of brightness values found

V5:V6 is the computed limits for brightness range.

Still referring to FIG. 7, if a UUT fails, e.g., UUT 1, a view error report button is displayed, e.g., view error report button 721, and subsequent to clicking thereon, an error report is generated and displayed as shown in FIG. 8. To view or change the settings, clicking on the settings button 731 will generate a settings/limits screen 901, as shown in FIG. 9.

It is noted that to be readily identifiable by an operator of testing apparatus 100, a tested UUT that passes has its node indicators left on amber, while a tested UUT that fails has its node indicators turned off.

FIG. 8A shows an error report screen 801 having been generated by testing software 180 in response to receiving a click upon a view error report button, e.g., view error report button 721 of FIG. 7. Error report screen 801 displays the information related to the brightness calibration unit. Within error report screen 801 are regions 803 and 805, for displaying error details related to the green LEDs and the amber LEDs respectively. Each error details region, e.g., regions 803 and 805 gives a complete listing of the brightness errors found by LED number.

If an LED fails the brightness test per the settings, then any color error is not displayed as it is likely to be erroneous (not enough brightness to tell the color).

FIG. 8B shows an error report screen 802 having been generated by testing software 180 in response to receiving a click upon a view error report button, e.g., view error report button 721 of FIG. 7. Error report screen 802 displays the information related to the color calibration unit. Within error report screen 802 are regions 804 and 806, for displaying error details related to the green LEDs and the amber LEDs respectively. Each error details region, e.g., regions 804 and 806 gives a complete listing of the color calibration errors found by LED number.

Referring to both FIGS. 8A and 8B, either error report screen 801 or 802 can be printed via print button 828. It is noted that for screen 801 or 802 to print correctly, the printer must be set for default landscape mode paper orientation.

FIG. 9 shows a setting/limits screen 901. Setting/limits screen 901 is generated by clicking on settings button 731 on the main screen 700. A password is required access settings button 731. Setting/limits screen 901 is used to set the pass/fail limits and should be changed in conjunction with test engineers. Any changes to the values in this screen will not be permanent unless "MAKE THESE THE PERMANENT TEST LIMITS" button 911 is clicked. When clicked, the limits are written to a "D:\LED Tester\led_test.ini" file.

Still referring to FIG. 9, "Fixture light ON" button 921 can be used to test if the illumination is working correctly or not. It is noted that button 921 is not to be pushed while LED tests are in process, or you may get a COM error. It is further noted that there is a delay between clicking and the light coming on. Further noted is if the light is left on and a test is run, an error will be generated and a user may have to reboot/log in as a different user.

Referring still to FIG. 9, AUTOPRINT button 931 generates an error report printout any time a unit fails. The "New File for each test" button 941 is used to generate a unique test result file if a unit is tested multiple times. It is noted that other buttons disposed within setting/limits screen 901 are for use by developers, and as such, are not described herein.

Each UUT that is tested generates a log file that is stored in a testlog directory. The testlog directory is stored in a portion of data storage 204 of FIG. 3. The file is stored as <UNIT_SERIALNUMBER>.txt, e.g. "FAB0548Y26G.TXT." Alignment data is also included in the log file but is primarily for developer use only. The testlog directory contains a record of every unit tested. A second copy is stored in an autotest\testlog directory. A makebatch program is used to generate two files, autotest.txt and autodebug.txt. The log file and the autotest.txt and autodebug.txt files are transferred to CISCO using ftp. It is noted that other file transfer protocols may be used.

A portion of testing software 180 is Matrox Inspector 3.1 software, adapted to capture images from the camera and performs pattern matching, calibration, and measures the average pixel value for each LED position. Another portion of testing software 180 is Visual Basis, adapted to provide the user interface and calls the Matrox software to take the measurements.

The visual basic program has a main loop where it scans all 5 UUT slots, e.g., TAR slots 151–155 of FIG. 1B, and executes code based on the state of the UUT in a TAR slot. Accordingly, the UUTs can boot up in parallel even though they have to be tested serially.

The following is, in one embodiment, a flow of the testing software program. For each TAR slot, the state code is executed. If the state is changed then the new state code will be executed the next time around in the loop. Otherwise the same state code gets executed. For each slot, the following is based on the slot state. Afterwards, the loop moves to the next slot or back to the first one, in an endless loop, as shown below.

State INIT:

Open the console port; this also turns the unit on via the power cycle box (power cycle box 131 of FIG. 1B). Set State=IDLE.

State IDLE:

Send the unit a <return>. If there is any response, set State=IDLE_TALKING.

State IDLE_TALKING:

Read unit system and serial number. Start the boot process. If all goes well, set State to BOOTING.

State BOOTING:

Send a <return> and look for "Command>" prompt with a two-second timeout. If no prompt, do nothing else. If a prompt is received set State to RUN.

State RUN:

It is noted that this is of primary relevance to the tester. Turn on the illumination. Run the test<n>_align( ) Matrox script and get back the alignment coordinates. Turn the illumination off. Run the test<n>_test( ) Matrox script and get back the mean pixel value for each LED position. Test these against the limits on the Settings form.

If it passes, set State=PASS. Otherwise, State=FAIL

State PASS:

Poll unit to see if the same serial number unit is attached. If no response or a different serial number, set State=INIT State FAIL:

Do nothing. User must click cell to restart this cell. User clicking the cell sets State=INIT.

Each TAR slot has its own Matrox basic subroutines that perform the measurement functions. These subroutines are called by the visual basic program portion of testing software 180. There are, in one embodiment, two main routines. The "uut<n>_align( )" routine is used to align the camera to the fixture and determine the location of the UUT within slot <n>. The "uut<n>_test( ) routine is then used to measure the mean pixel value of each LED location for slot <n>.

The "uut<n>_align( )" function does the following. It needs the illumination, e.g., illumination 120, turned on while it is run.

The "uut<n>_align( )" function causes a picture taken of the whole fixture. It searches for the alignment dots (alignment dots 158 of FIG. 6) and uses the location of alignment dots 158 to determine if camera is rotated and at what angle.

Using the same image or picture, it finds the "fiducial" pattern 1001 of FIG. 10 (see area in white box in FIG. 10) to locate the unit in the slot.

The above function rotates the captured image to compensate for fixture rotation, and calibrate the image to remove lens distortion. The function finds the locations in the calibrated image of the two fiducials near LEDs 16, 17 and 32, 33. The function also returns all alignment information to the caller. The above function also reports errors, as shown in Table Two, below.

TABLE TWO

"CANNOT FIND RIGHT ALIGNMENT DOT ON FIXTURE" -
cannot find the right fixture dot (Dots 158 of FIG. 6).
This is caused by either camera malfunction or
illuminator problems such as a bulb being burned out.
"CANNOT FIND LEFT ALIGNMENT DOT ON FIXTURE" -
cannot find the right fixture dot (dots 158 of FIG. 6).
This is caused by either camera malfunction or
illuminator problems such as a bulb being burned out.
"UNIT MISALIGNED" -
cannot find the fiducial on the unit.
Illuminator problem or unit not pushed
into the slot, front panel label damaged, etc.
"CANNOT FIND ALIGNMENT PATTERN
ON RIGHT SECTION OF UUT" -
cannot find the fiducial pattern between
LEDs 32 and 33. Same possible causes as above.
"CANNOT FIND ALIGNMENT PATTERN
ON LEFT SECTION OF UUT" -
cannot find the fiducial pattern between
LEDs 16 and 17. Same possible causes as above.

The other function, UUT<n>_test( ) does the following. It is passed as an argument with the alignment data from the UUT<n>_align( ) function. It needs the illumination turned off while it is run.

The UUT<n>_test( ) function takes a picture of the entire fixture. Using the alignment data, it locates the slot of interest, rotates to compensate for camera rotation and calibrates to remove lens distortion.

The UUT<n>_test( ) function uses the fiducial locations 1001, as shown in FIG. 10, as an origin and finds the LED locations as a fixed offset. The function measures the mean RGB (red, green, blue) values for a rectangular ROI (region of interest) enclosing the LED location. It is noted that the ROI is larger than the LED by about 2 pixels in each dimension to accommodate misalignment errors. The UUT<n>_test( ) function also provides special handling for GBIC (giga-bit interface connector) LEDs: because the GBIC LEDs are much brighter than the port LEDs, the camera gain is turned down to measure these LEDs color values. If this was not done, then the pixels would saturate and color information would not be correct.

For each LED location, function UUT<n>_test( ) calculates color and brightness from the average R,G,B values as shown in Table 3, below.

TABLE THREE

If the blue value is more than 20% of the average of red + green,
then color = 99 (illegal value)
If green > red, color = integer part of (G/R)*10.
If ratio > 98, saturate at 98
If green < = red, color = - integer part of (R/G)*10.
If ratio < -98, saturate at -98
Brightness = (red + green)/2

The brightness of the LEDs is measured as a relative number. The scale factor depends on camera 110 sensitivity and the lens iris setting. The brightness number of an LED is calculated using the average pixel value of the LED ROI (Region Of Interest). The LED ROI is a square area around the port LED that should include all LED pixels. An LED'd ROI contains pixels that are not illuminated (it is square while the LED is oval, and the square is bigger than the oval to accommodate alignment errors), and therefore the average pixel value is much less than the maximum pixel value.

The brightness number is calculated as (average red+ average green)/5. This averages and scales the value. If the number is >99 it is forced to be 99 (it saturates). The color limit is expressed as a ratio of G/R for positive values and R/G for negative values. This means that −10 is the same as 10, and all values in between are not allowed. To simplify dealing with pixel values, the blue is ignored. However if the average blue pixel value is more than 20% of the brightness, then the color value is set to 99 which is defined as illegal.

Calibration of testing apparatus's test fixture is facilitated by using "known bad" network communication devices 500 whose LEDs have been internally covered up to reduce their light output. There are two of these units: one for brightness and one for color. FIG. 11A shows a brightness calibration unit 1101.

Referring to FIG. 11A, the brightness calibration unit 101 has LEDs which should fail both green and amber brightness checks. It is noted that ports 17 through 32 are to be used, while ignoring the results for all other LEDs. The brightness procedure can be performed as shown in Table Four, below.

TABLE FOUR

Insert the unit into slot #3 (middle). Run the LED test on it.
It should fail with the report as in Picture 6. Ignore all errors
for LED 1–16 and 33–50 as they were used for debug only.
For green, LEDS 18, 23, 27 should fail brightness.
For amber, LEDs 18, 25, 26, and 27 should fail brightness.
If there are different failures than shown in the above,
go to the Settings screen (Click on Settings button on main menu).
Change the Green Bright Limit up by 1 if more than the above LEDS
are failing, and down by 1 if not all of the LEDs above are failing.
Repeat the test, and change the values until the LEDs fail as above.
Verify the same results can be obtained in TAR slots #1, 2, 4, and 5.
It is noted that there is a +/− 1 basic accuracy between slots
so the limit may have to be changed for best results across all slots.
This slot-to-slot test is only valid for the LEDs 17–32
because some of LEDs 1–16 have their light pipes deformed
and have viewing angle brightness variations.
Click on MAKE THESE THE PERMANENT TEST LIMITS
button to write the limit values to a file that
will be used from now on to set the limits.

It is noted that the light pipe used in the C3548 unit can become aligned in a way that gives different brightness results (+/−2 or more) in slot 5 versus slot 1. This is due to the angle that the camera looks at the unit which is either 9.5 degrees above the unit (slot 1) or below the unit (slot 5). The alignment unit should not see a big variation slot-to-slot but it is possible if the light pipe moves around inside the unit. If a unit fails in one slot and passes in another it may be due to the light pipe alignment.

Referring to FIGS. 11B and 11C, color calibration unit 1102 has one LED that is amber when it should be green (LED #34), and one that is green when it should be amber (LED #33). This can be used to verify that the tester is capable of recognizing wrong color LEDs. The color calibration procedure can be performed as shown in Table Five, below.

TABLE FIVE

Insert the unit into slot #3 (middle).
Run the LED test on it. It should fail with the
following report (as shown in FIG. 8B)
LED #33: Green Brightness error, Amber color error
LED #34: Amber Brightness error, Green color error.
Ignore the brightness error. If the green color error does not
show up, reduce the Green Color Limit setting by 1 and try again.
If more than LED #34 shows a green color error,
add 1 to the Green Color Limit and try again.
Do the same for the Amber Limit, only add 1 to the low limit to
make
the test less stringent, and subtract 1 to make it more stringent.

FIG. 12 is a flowchart 1200 of steps performed in accordance with one embodiment of the present invention for testing node indicators in a network communication device, e.g., network switch 500. Flowchart 1200 includes processes of the present invention which, in one embodiment, are carried out by processors and electrical components under the control of computer readable and computer executable instructions. The computer readable and computer executable instructions reside, for example, in data storage features such as computer usable volatile memory 202 and/or computer usable non-volatile memory 203 of FIG. 3. However, the computer readable and computer executable instructions may reside in any type of computer readable medium. Although specific steps are disclosed in flowchart 1200, such steps are exemplary. That is, the present invention is well suited to performing various other steps or variations of the steps recited in FIG. 12. Within the present embodiment, it should be appreciated that the steps of flowchart 1200 may be performed by software, by hardware or by any combination of software and hardware.

In step 1210 of FIG. 12, a network communication device 500, e.g., a CISCO C3548 switch, is received in a TAR (testing apparatus receiving) slot of testing apparatus 100, as shown in FIG. 5 and also shown in a rear-facing view in FIG. 6. The node indicator lights coupled to network communication device 500 are then tested. In one embodiment, testing of the indicating lights is commenced upon insertion of a network device into a TAR slot.

In step 1220 of FIG. 12, images of the node indicator lights are captured by an imaging device, e.g., camera 110. Illuminating lamps 120 are activated and deactivated during the capturing of the images by camera 110. The lamps 120 are controlled by a toggling of the DTR line on adapter 142 P5 of FIG. 1B.

In step 1230 of FIG. 12, data is generated from the testing. In one embodiment, the data generated is stored in a data storage device, e.g., data storage device 204 of FIG. 3. The data is then processed by testing software 180 of FIGS. 1A and 3.

In step 1240 of FIG. 12, the data is then processed by testing software 180 of FIGS. 1A and 3, and the results of the testing are viewable displayed via a display device, e.g., display device 205 of FIG. 3. Various results can be displayed, e.g., a UUT failure as shown in FIG. 7. An error report regarding brightness of the failed UUT can also be generated, as seen in FIG. 8A. Alternatively, an error report regarding color value of a failed UUT can also be generated, as shown in FIG. 8B. Additional results can be displayed, e.g., an image of the node indicator under testing, as seen in FIGS. 11A to 11C.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An apparatus for determining conditions of light indicators of an electronic device comprising:
   a housing for accepting said electronic device;
   a testing unit coupled to said electronic device, wherein said testing unit performs a plurality of tests on said electronic device;
   an imaging device which captures an image of said light indicators while said testing unit performs a test on said electronic device, wherein said image of said light indicators are compared to a result of said test to determine said conditions of said light indicators.

2. The apparatus of claim 1 further comprising:
   a plurality of receiving slots mountably attached to said housing, said receiving slots adapted to accept a plurality of electronic devices, wherein conditions of light indicators of said plurality of electronic devices are determined simultaneously by comparing an image of said light indicators of said plurality of electronic device to tests performed on said plurality of electronic devices.

3. The apparatus of claim 2 wherein a first portion of said plurality of receiving slots are communicatively and removeably coupled to a first adapter, said first adapter to be coupled to a first communication interface disposed within a electronic computer system.

4. The apparatus of claim 2 wherein a second portion of said receiving slots are communicatively and removeably coupled to a second adapter, said second adapter to be coupled to as second communication interface disposed within an electronic computer system.

5. The apparatus of claim 1 further comprising an illuminating device for providing illumination of said light indicators during said test, said illuminating device adapted to coupled with and controlled by an electronic computer system.

6. The apparatus of claim 5 wherein said electronic computer system includes memory having software instructions for controlling and analyzing said test of said light indicators.

7. The apparatus of claim 1 wherein said imaging device is a color digital camera.

8. The apparatus of claim 1 wherein said testing unit tests for brightness, color, and pass/fail defect conditions of said light indicators.

9. A system for testing of node indicators in a network communication device comprising:
   a testing apparatus for said testing of said node indicators;
   a digital imaging device for capturing a digital image of said node indicators;
   an electronic computer system for processing and displaying data from said testing of said node indicators and said digital image, said electronic computer system coupled with said testing apparatus.

10. The system of claim 9 wherein said testing apparatus comprises:
    a housing adapted for having disposed therewith said illuminatable indicator testing apparatus;
    a plurality of receiving slots mountably attached to said housing, said receiving slots adapted to have a plurality of illuminatable indicators electronically and communicatively removeably coupled therewith; and
    an imaging device mountably attached to said housing, said imaging device adapted to capture an image of said illuminatable indicators during said testing.

11. The system of claim 9 further comprising a hardware lock connection adapted to be removeably coupled with a parallel port of said electronic computer system.

12. The system of claim 10 wherein said imaging device further comprises an electrical and communicative connector adapted to be removeably coupled to said electronic computer system.

13. The system of claim 10 wherein a first portion of said plurality of receiving slots are communicatively and removeably coupled to a first adapter, said first adapter to be coupled to a first communication interface disposed within said electronic computer system.

14. The system of claim 10 wherein a second portion of said receiving slots are communicatively and removeably coupled to a second adapter, said second adapter to be coupled to as second communication interface disposed within an electronic computer system.

15. The system of claim 10 further comprising an illuminating device for providing illumination of said illuminatable indicators during said testing, said illuminating device adapted to coupled with and controlled by said electronic computer system.

16. The system of claim 10 wherein said imaging device is a color digital camera.

17. The system of claim 10 wherein said electronic computer system, communicatively and removeably coupled to said testing apparatus, is configured to receive and interpret and viewably display data related to said testing, said data provided to said electronic computer system by an imaging device and a plurality of receiving slots housed in said testing apparatus.

18. The system of claim 9 wherein said electronic computer system is comprising:
   a bus;
   a memory unit coupled to said bus, said memory unit for storing software for controlling said testing and said data regarding said testing;
   a processor coupled to said bus;
   a display device coupled to said bus, said display device for displaying said data regarding said testing; and
   an interface card coupled with said bus, said interface card adapted to have coupled therewith an imaging device of said testing apparatus.

19. The system of claim 9 wherein said electronic computer system further comprises a first communication interface adapted to be coupled with a first adapter coupled with said testing apparatus.

20. The system of claim 9 wherein said electronic computer system further comprises a second communication interface adapted to be coupled with a second adapter coupled with said testing apparatus.

21. A method of determining conditions of light indicators of an electronic device comprising:
   performing a series of tests on said electronic device;
   capturing images of said light indicators as said series of tests on said electronic device are conducted;
   generating data regarding said conditions of said light indicators by analyzing said images of said light indicators.

22. The method as recited in claim 20 further comprising analyzing said data regarding said testing.

23. The method as recited in claim 20 further comprising generating a viewable display of results of said testing.

24. The method as recited in claim 21 further comprising comparing testing said light indicators for brightness, color, and pass/fail defect.

25. The method as recited in claim 22 further comprising:
   testing a plurality of electronic devices in parallel;
   capturing one image of a plurality of light indicators corresponding to said plurality of electronic devices;
   determining conditions of said plurality of light indicators corresponding to said plurality of electronic devices by analyzing the one image.

26. An apparatus for determining conditions of light indicators of an electronic device comprising:
   means for performing a series of tests on said electronic device;
   means for capturing images of said light indicators as said series of tests on said electronic device are conducted;
   means for generating data regarding said conditions of said light indicators by analyzing said images of said light indicators.

27. The apparatus as recited in claim 26 further comprising means for generating a viewable display of results of said testing.

28. The apparatus as recited in claim 26 further comprising means for testing said light indicators for brightness, color, and pass/fail defect.

29. The apparatus as recited in claim 26 further comprising:
   means for testing a plurality of electronic devices in parallel;
   means for capturing one image of a plurality of light indicators corresponding to said plurality of electronic devices;
   means for determining conditions of said plurality of light indicators corresponding to said plurality of electronic devices by analyzing the one image.

* * * * *